United States Patent
Ueyama et al.

(10) Patent No.: US 11,581,482 B2
(45) Date of Patent: Feb. 14, 2023

(54) PIEZOELECTRIC CERAMIC AND METHOD FOR MANUFACTURING SAME, AS WELL AS PIEZOELECTRIC ELEMENT

(71) Applicant: TAIYO YUDEN CO., LTD., Tokyo (JP)

(72) Inventors: Yuuhei Ueyama, Takasaki (JP); Tomohiro Harada, Takasaki (JP); Hiroyuki Shimizu, Takasaki (JP); Sumiaki Kishimoto, Takasaki (JP); Yukihiro Konishi, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 446 days.

(21) Appl. No.: 16/800,894

(22) Filed: Feb. 25, 2020

(65) Prior Publication Data

US 2020/0287124 A1 Sep. 10, 2020

(30) Foreign Application Priority Data

Mar. 5, 2019 (JP) .............................. JP2019-039913

(51) Int. Cl.
*H01L 41/187* (2006.01)
*H01L 41/43* (2013.01)
*H01L 41/047* (2006.01)
*C04B 35/475* (2006.01)
*C04B 35/64* (2006.01)
*C04B 35/626* (2006.01)

(52) U.S. Cl.
CPC ........ *H01L 41/1878* (2013.01); *C04B 35/475* (2013.01); *C04B 35/62645* (2013.01); *C04B 35/64* (2013.01); *H01L 41/0472* (2013.01); *H01L 41/1871* (2013.01); *H01L 41/43* (2013.01); *C04B 2235/3201* (2013.01); *C04B 2235/3215* (2013.01); *C04B 2235/3232* (2013.01); *C04B 2235/3262* (2013.01); *C04B 2235/3298* (2013.01); *C04B 2235/5409* (2013.01); *C04B 2235/661* (2013.01)

(58) Field of Classification Search
CPC . H01L 41/43; H01L 41/1878; H01L 41/0472; H01L 41/0471; C04B 35/64; C04B 35/62645; C04B 35/475; C04B 2235/3201; C04B 2235/3215; C04B 2235/3232; C04B 2235/3262; C04B 2235/3298; C04B 2235/5409
See application file for complete search history.

(56) References Cited

U.S. PATENT DOCUMENTS 7,090,785 B2 * 8/2006 Chiang ............... C04B 35/6261
117/948

FOREIGN PATENT DOCUMENTS

| JP | 2003201172 A | 7/2003 |
| JP | 2004018321 A | 1/2004 |
| JP | 2006327863 A | 12/2006 |

* cited by examiner

*Primary Examiner* — C Melissa Koslow
(74) *Attorney, Agent, or Firm* — Law Office of Katsuhiro Arai

(57) ABSTRACT

A piezoelectric ceramic, which does not contain lead as a constituent element, is characterized in that: its primary component is a perovskite compound expressed by the composition formula $(Bi_{0.5-x/2}Na_{0.5-x/2}Ba_x)(Ti_{1-y}Mn_y)O_3$ (where $0.01 \leq x \leq 0.25$, $0.001 \leq y \leq 0.020$); and the coefficient of variation (CV) in grain size among the grains contained therein is 35 percent or lower. The piezoelectric ceramic presents an improved dielectric loss tangent tan δ.

6 Claims, 1 Drawing Sheet

PIEZOELECTRIC CERAMIC AND METHOD FOR MANUFACTURING SAME, AS WELL AS PIEZOELECTRIC ELEMENT

CROSS-REFERENCE TO RELATED APPLICATIONS

The present application claims priority to Japanese Patent Application No. 2019-039913, filed Mar. 5, 2019, the disclosure of which is incorporated herein by reference in its entirety including any and all particular combinations of the features disclosed therein.

BACKGROUND

Field of the Invention

The present invention relates to a piezoelectric ceramic and a method for manufacturing the same, as well as a piezoelectric element.

Description of the Related Art

Piezoelectric elements are used as sensor elements, power generating elements, etc., that utilize the direct piezoelectric effect through which mechanical energy is converted into electrical energy. Also, piezoelectric elements are used in oscillators, sounding bodies, actuators, ultrasonic motors, pumps, etc., that utilize the inverse piezoelectric effect through which electrical energy is converted into mechanical energy. Furthermore, piezoelectric elements are used as circuit elements, vibration control elements, etc., that utilize a combination of the direct piezoelectric effect and the inverse piezoelectric effect.

In the compositions of piezoelectric ceramics that constitute piezoelectric elements, lead titanate zirconate (Pb(Zr, Ti)$O_3$, PZT) and solid solutions thereof are widely used. These PZT-based piezoelectric ceramics, although offering excellent piezoelectric characteristics, are viewed as problematic in that they contain lead which is a harmful substance; accordingly, efforts are underway to develop alternative piezoelectric ceramics that are lead-free.

As examples of lead-free piezoelectric ceramic compositions, ones whose primary components are bismuth sodium titanate ((Bi$_{0.5}$Na$_{0.5}$)TiO$_3$, BNT) and barium titanate (BaTiO$_3$, BT) (BNT-BT-based) are reported (Patent Literatures 1 to 3). For example, Patent Literature 3 states that the piezoelectric ceramic described in the literature is suitable for elements used in bolt-clamped Langevin-type ultrasonic oscillators and other strong ultrasonic application devices for cleaning machines and processing machines, as well as in ultrasonic oscillators for fish detection machines, etc., because its electromechanical coupling coefficient kt, mechanical quality coefficient Qm, specific dielectric constant $\varepsilon_{33}^T/\varepsilon_0$, and Curie temperature Tc are relatively high.

BACKGROUND ART LITERATURES

[Patent Literature 1] Japanese Patent Laid-open No. 2004-18321
[Patent Literature 2] Japanese Patent Laid-open No. 2003-201172
[Patent Literature 3] Japanese Patent Laid-open No. 2006-327863

SUMMARY

Piezoelectric ceramics used for ultrasonic oscillators are required to have a high mechanical quality coefficient Qm, as well as a small dielectric loss tangent tan δ, in order to suppress heat generation during oscillation.

To obtain a piezoelectric ceramic having a high mechanical quality coefficient Qm in Patent Literatures 1 and 2, and to obtain such a piezoelectric ceramic that also has a small dielectric loss tangent tan δ in Patent Literature 3, compositional studies were conducted and limited successes were achieved. From the practical aspects of ultrasonic oscillators, however, further improved characteristics are required of piezoelectric ceramics.

In light of the above, an object of the present invention is to provide a piezoelectric ceramic whose dielectric loss tangent tan δ, among the aforementioned characteristics, has been improved.

The inventor of the present invention conducted various studies to solve the aforementioned problems and found that the problems could be solved by lowering the coefficient of variation (CV) (which may be referred to as "C.V.") in grain size among the sintered grains that constitute the piezoelectric ceramic, and eventually completed the present invention.

To be specific, an aspect of the present invention to solve the aforementioned problems is a piezoelectric ceramic that does not contain lead as a constituent element, wherein such piezoelectric ceramic is characterized in that: its primary component is a perovskite compound expressed by the composition formula (Bi$_{0.5-x/2}$Na$_{0.5-x/2}$Ba$_x$)(Ti$_{1-y}$Mn$_y$)O$_3$ (where $0.01 \leq x \leq 0.25$, $0.001 \leq y \leq 0.020$); and the coefficient of variation (CV) in grain size among the grains contained therein is 35 percent or lower.

Additionally, another aspect of the present invention is a method for manufacturing piezoelectric ceramic that does not contain lead as a constituent element, wherein such method for manufacturing piezoelectric ceramic is characterized in that it includes: mixing prescribed quantities of bismuth compound powder, sodium compound powder, barium compound powder, titanium compound powder, and manganese compound powder to obtain a mixed powder; calcining the mixed powder to obtain a calcined powder; compacting the calcined powder into a prescribed shape to obtain a compact; and sintering the compact to obtain a sintered compact whose primary component is a perovskite compound expressed by the composition formula (Bi$_{0.5-x/2}$Na$_{0.5-x/2}$Ba$_x$)(Ti$_{1-y}$Mn$_y$)O$_3$ (where $0.01 \leq x \leq 0.25$, $0.001 \leq y \leq 0.020$); wherein the titanium compound powder represents TiO$_2$ with a specific surface area of 10 m$^2$/g or larger.

Furthermore, yet another aspect of the present invention is a piezoelectric element comprising the aforementioned piezoelectric ceramic and electrodes connected electrically to the piezoelectric ceramic.

According to the present invention, a piezoelectric ceramic presenting an improved dielectric loss tangent tan δ can be provided.

DESCRIPTION OF THE SYMBOLS

Figure 1A:
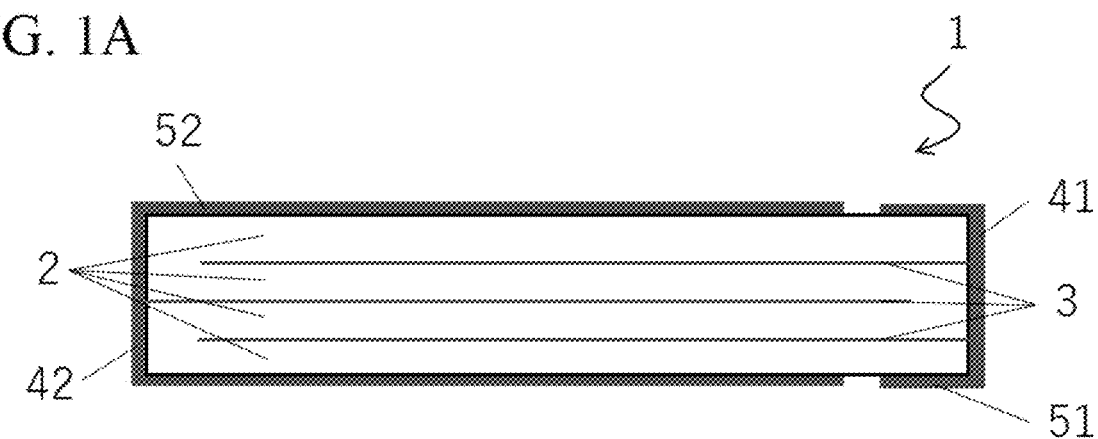
FIGS. 1A and 1B are schematic views showing the structure of a multilayer piezoelectric element (1A is a front view, while 1B is a perspective view)

1 Multilayer piezoelectric element
2 Piezoelectric ceramic layer
3 Internal electrode layer
41, 42 Connection conductor
51, 52 Surface electrode

DETAILED DESCRIPTION OF EMBODIMENTS

The constitutions as well as operations and effects of the present invention are explained below, together with the technical ideas, by referring to the drawings. It should be noted, however, that the mechanisms of operations include estimations and whether they are right or wrong does not limit the present invention in any way. Also, among the constituent components recited in any embodiments disclosed herein and associated with any aspects disclosed below, those constituent components not described in a manner representing the most generic scope/concepts are explained as optional constituent components which can constitute any embodiments representing more specific scope/concepts than the most generic scope/concepts in any one or more respects. It should be noted that a description of numerical range (description of two values connected by "to") is interpreted to include the described values as the lower limit and the upper limit.

Piezoelectric Ceramic

The piezoelectric ceramic pertaining to an aspect of the present invention (hereinafter also referred to simply as "first aspect") does not contain lead as a constituent element and is characterized in that: its primary component is a perovskite compound expressed by the composition formula $(Bi_{0.5-x/2}Na_{0.5-x/2}Ba_x)(Ti_{1-y}Mn_y)O_3$ (where $0.01 \leq x \leq 0.25$, $0.001 \leq y \leq 0.020$); and the coefficient of variation (CV) in grain size among the grains contained therein is 35 percent or lower.

The first aspect can reduce burdens on the environment because it does not contain lead as a constituent element. In this disclosure, "... does not contain lead as a constituent element" means that lead is not contained except for lead that is unavoidably contained in the material or lead that unavoidably mixes in during the manufacturing process to the extent that lead does not materially change the characteristics of the resultant piezoelectric ceramic for its intended use or application. Likewise, in this disclosure, "... does not contain an element M as a constituent element" means that M is not contained except for M that is unavoidably contained in the material or M that unavoidably mixes in during the manufacturing process to the extent that M does not materially change the characteristics of the resultant piezoelectric ceramic for its intended use or application. Further, in this disclosure, in some embodiments, any one or more of the disclosed elements or components as options can be exclusively selected or can expressly be excluded, depending on the target piezoelectric ceramic to be manufactured, its target properties, etc., and/or for practical reasons, operational reasons, etc.

The first aspect has, as its primary component, a perovskite compound expressed by the composition formula $(Bi_{0.5-x/2}Na_{0.5-x/2}Ba_x)(Ti_{1-y}Mn_y)O_3$ (where $0.01 \leq x \leq 0.25$, $0.001 \leq y \leq 0.020$). Here, in this disclosure, the "primary component" refers to the component contained in the largest quantity in the piezoelectric ceramic based on mass. In some embodiments, it further refers to a piezoelectric ceramic wherein the above perovskite structure is substantially maintained as if it contains no other indispensable constituent element(s).

In the aforementioned composition formula, the value of x, or specifically the content percentage of Ba, is 0.01 to 0.25. By adjusting the value of x in this range, excellent piezoelectric characteristics can be achieved along with a high Curie temperature.

In the aforementioned composition formula, the value of y, or specifically the content percentage of Mn, is 0.001 to 0.020. By adjusting the content percentage of Mn to 0.001 or higher, a high mechanical quality coefficient Qm can be achieved. The value of y is preferably 0.005 or higher, or more preferably 0.0075 or higher. When the content of Mn is adjusted to 0.020 or lower, on the other hand, production of Mn-rich deposits can be inhibited and consequently lowering of piezoelectric characteristics can be inhibited.

The first aspect may contain other additive elements or compounds so long as its primary component is a perovskite compound having the aforementioned composition formula. Examples of additive elements include: Li, K, Ca, Sr, etc., that can be replaced with Bi, Na, or Ba; Nb, Ta, Zr, Fe, Zn, etc., that can be replaced with Ti; and F, etc., that can be replaced with O. Examples of compounds include glassy intergranular phases, etc., derived from those components added to lower the sintering temperature.

Here, that the first aspect has a perovskite compound expressed by the aforementioned composition formula, as its primary component, is confirmed by: using an X-ray diffraction (XRD) system based on Cu-Kα rays to measure the diffraction line profiles of a powder obtained by pulverizing the piezoelectric ceramic, and confirming that the ratios of the strongest diffraction line intensities in the diffraction profiles derived from other structures, to the strongest diffraction line intensity in the profile derived from the perovskite structure, are 10 percent or lower; and then measuring the content ratios of the respective elements using a high-frequency inductively coupled plasma (ICP) emission spectrophotometer, ion chromatographic system, or X-ray fluorescence (XRF) analyzer, and confirming that the measured results represent the ratios in the aforementioned composition formula.

In the first aspect, the coefficient of variation (CV) in grain size among the grains contained therein is 35 percent or lower. By lowering the coefficient of variation (CV) in grain size, the microstructure becomes more uniform and the dielectric loss tangent tan δ drops as a result. The coefficient of variation (CV) is preferably 32 percent or lower, or more preferably 30 percent or lower.

In the first aspect, preferably the average grain size $r_{avg}$ of the grains contained therein is adjusted to 3 μm or larger. By adjusting the average grain size $r_{avg}$ to 3 μm or larger, a high mechanical quality coefficient Qm will be achieved when the piezoelectric ceramic is made into a piezoelectric element. More preferably the average grain size $r_{avg}$ is adjusted to 3.5 μm or larger. The upper-limit value of the average grain size $r_{avg}$, although not limited in any way, is preferably kept to 10 μm or smaller from the viewpoint of inhibiting a drop in mechanical strength due to coarse grains.

Here, the average grain size $r_{avg}$ and coefficient of variation (CV) in grain size in the first aspect are determined according to the steps below.

First, platinum is vapor-deposited on the surface of the piezoelectric ceramic to add conductivity, to produce a measurement sample.

Next, the measurement sample is observed with a scanning electron microscope (SEM) and four to six photos are taken at randomly selected locations (which appear to roughly represent the entire piezoelectric ceramic) at a magnification that allows approx. 60 to 200 grains to be seen in the view field.

Next, the captured micrographs are image-processed to calculate the circle-equivalent diameter of each grain.

Next, the average grain size $r_{avg}$ is calculated from the obtained circle-equivalent diameters $r_i$ of individual grains and the number n of $r_i$-calculated grains, using (Formula 1) below, and the result is used as the average grain size $r_{avg}$ of the piezoelectric ceramic.

Next, the standard deviation s of grain sizes is calculated from the obtained value of average grain size $r_{avg}$, using (Formula 2) below.

Lastly, the coefficient of variation (CV) is calculated from the obtained values of average grain size $r_{avg}$ and standard deviation s, using (Formula 3), and the result is used as the coefficient of variation (CV) in grain size pertaining to the piezoelectric ceramic.

[Math. 1]

$$r_{avg} = \frac{1}{n}\sum_{i=1}^{n} r_i \qquad \text{(Formula 1)}$$

[Math. 2]

$$s = \sqrt{\frac{\sum_{i=1}^{n} r_i^2 - n(r_{avg})^2}{n-1}} \qquad \text{(Formula 2)}$$

[Math. 3]

$$C.V. = \frac{s}{r_{avg}} \qquad \text{(Formula 3)}$$

When the aforementioned surface observation of the piezoelectric ceramic is performed on a polished surface, parts of the piezoelectric ceramic surface are removed and the grain profiles may become unclear as a result. In this case, heat treatment (thermal etching) should be provided at a temperature of 900 to 960° C. for approx. 15 to 30 minutes prior to performing the aforementioned steps.

Method for Manufacturing Piezoelectric Ceramic

The method for manufacturing piezoelectric ceramic pertaining to another aspect of the present invention (hereinafter also referred to simply as "second aspect") is for manufacturing piezoelectric ceramic that does not contain lead as a constituent element, which is characterized in that it includes: mixing prescribed quantities of bismuth compound powder, sodium compound powder, barium compound powder, titanium compound powder, and manganese compound powder to obtain a mixed powder; calcining the mixed powder to obtain a calcined powder; compacting the calcined powder into a prescribed shape to obtain a compact; and sintering the compact to obtain a sintered compact whose primary component is a perovskite compound expressed by the composition formula $(Bi_{0.5-x/2}Na_{0.5-x/2}Ba_x)(Ti_{1-y}Mn_y)O_3$ (where $0.01 \leq x \leq 0.25$, $0.001 \leq y \leq 0.020$); wherein the titanium compound powder represents $TiO_2$ with a specific surface area of 10 m²/g or larger.

In the second aspect, the bismuth compound powder, sodium compound powder, barium compound powder, and manganese compound powder, which are used as materials, are not limited in any way so long as they are powders of compounds containing these elements. The compound constituting each powder may contain multiple types of elements among the foregoing, or it may contain additive elements other than these elements.

Examples of compounds that can be used include bismuth oxide ($Bi_2O_3$) or bismuth oxychloride (BiOCl) as a bismuth compound, sodium carbonate ($Na_2CO_3$) or sodium hydrogen carbonate ($NaHCO_3$) as a sodium compound, barium carbonate ($BaCO_3$) as a barium compound, manganese carbonate ($MnCO_3$) as a manganese compound, and the like.

In the second aspect, a $TiO_2$ powder with a specific surface area of 10 m²/g or larger is used as a material titanium compound. By using a $TiO_2$ powder of large specific surface area as a material, the grain size variability of the grains constituting the piezoelectric ceramic to be obtained can be suppressed and its dielectric loss tangent tan δ can be lowered. The specific surface area of the $TiO_2$ powder is adjusted preferably to 15 m²/g or larger, or more preferably to 20 m²/g or larger, or yet more preferably to 25 m²/g or larger.

Although the mechanism of why a piezoelectric ceramic of low dielectric loss tangent tan δ can be obtained by using a $TiO_2$ powder of large specific surface area is not clear, conceivably it has something to do with larger contact areas between the $TiO_2$ powder and other material powders in the mixed powder. To be specific, the piezoelectric ceramic manufactured under the second aspect is understood, from its composition, as a mixed crystal of a $(Bi_{0.5}Na_{0.5})TiO_3$ (BNT)-type compound and a $BaTiO_3$ (BT)-type compound, and because Ti is an essential element in both compounds, presence of Ti is indispensable in the production of these compounds. For these compounds to be produced in locations other than where the $TiO_2$ powder is contacting other material powders in the mixed powder, Ti and other elements must migrate through diffusions to react with one another; when the contact areas between the $TiO_2$ powder and other material powders are small, however, conceivably the distances of these diffusions become inevitably longer and therefore numerous grains with many atomic-level compositional nonuniformities and structural defects will be contained in the calcined powder obtained by calcining. Conceivably these compositional nonuniformities and structural defects will cause the driving force behind grain growth to vary locally during final sintering, thereby resulting in grain size nonuniformities in the piezoelectric ceramic. By contrast, when the contact areas between the $TiO_2$ powder and other material powders are large in the mixed powder, as is the case in the second aspect, conceivably these compositional nonuniformities and structural defects are fewer and therefore a piezoelectric ceramic of smaller grain size variability can be obtained.

Here, the specific surface area of the $TiO_2$ powder is measured/calculated with a fully automated specific surface area measuring device using the nitrogen gas adsorption method. First, the measurement sample is deaerated in a heater, after which nitrogen gas is adsorbed and desorbed onto/from the measurement sample, to measure the adsorbed nitrogen quantity. Next, the monomolecular layer adsorption quantity is calculated from the obtained adsorbed nitrogen quantity using the BET 1-point method, and from this value, the surface area of the sample is derived using the area occupied by one nitrogen molecule and the value of Avogadro's number. Lastly, the obtained surface area of the sample is divided by the mass of the sample, to obtain the specific surface area of the powder. It should be noted that, if the specific surface area of the $TiO_2$ powder used is published in a catalog, etc., the published value may be adopted.

The method for mixing the materials is not limited in any way so long as the respective powders are mixed uniformly while mixing-in of impurities is inhibited, and either dry mixing or wet mixing may be adopted. If wet mixing using a ball mill is adopted, the mixing should be performed for approx. 8 to 24 hours, for example.

The calcining conditions are not limited so long as the respective materials will react with one another and a calcined powder will be obtained whose primary component is a perovskite compound expressed by the aforementioned composition formula, and should be 2 to 8 hours at 700 to 1000° C. in the air, for example. If the calcining temperature is too low or the calcining period is too short, there are concerns that unreacted materials or intermediate products may remain. If the calcining temperature is too high or the calcining period is too long, on the other hand, there are concerns that sodium will volatilize and a compound of the desired composition may not be obtained, or generated substances will agglomerate and become harder to disintegrate, thus causing productivity to drop.

For the method for compacting the calcined powder, any method normally used to compact a ceramic powder, such as uniaxially pressing a powder, extruding a green body containing a powder, casting a slurry in which a powder has been dispersed, or the like, may be adopted. It should be noted that the forming method for obtaining a multilayer piezoelectric element will be explained in the method for manufacturing the element as described below.

The conditions under which to sinter the compact are not limited so long as a dense piezoelectric ceramic can be obtained, and should be 1 to 5 hours at 900 to 1200° C. in the air, for example. If the sintering temperature is too low or the sintering period is too short, there are concerns that insufficient densification may inhibit a compound of the desired composition from being obtained. If the sintering temperature is too high or the sintering period is too long, on the other hand, there are concerns that volatilization of sodium, etc., may tip the balance of composition, or production of coarse grains may lower properties. From the viewpoint of inhibiting such volatilization of sodium or production of coarse grains during sintering, preferably the upper limit of sintering temperature is kept to 1100° C.

Piezoelectric Element

When electrodes are formed on its surface and polarized, the piezoelectric ceramic pertaining to the first aspect, or piezoelectric ceramic obtained under the second aspect, will become a piezoelectric element.

For the forming of electrodes, any commonly used method, such as one whereby a paste that contains an electrode material is applied or printed and then baked on the piezoelectric ceramic surface, or one whereby an electrode material is deposited on the piezoelectric ceramic surface, may be adopted. The electrode material is not limited in any way so long as it is highly conductive and also physically and chemically stable in the use environment of the piezoelectric element. Examples of electrode materials that can be used include silver (Ag), copper (Cu), gold (Au), platinum (Pt), palladium (Pd), nickel (Ni), alloys thereof, and the like.

The polarization conditions are not limited in any way so long as the orientations of spontaneous polarizations can be aligned without causing cracks or other damage to the piezoelectric ceramic. As an example, an electric field of 4 to 6 kV/mm may be applied at a temperature of 100 to 150° C.

Multilayer Piezoelectric Element

The aforementioned piezoelectric element may be a multilayer piezoelectric element. The structure of a multilayer piezoelectric element is explained below by referring to FIGS. 1A and 1B.

Figure 1B:
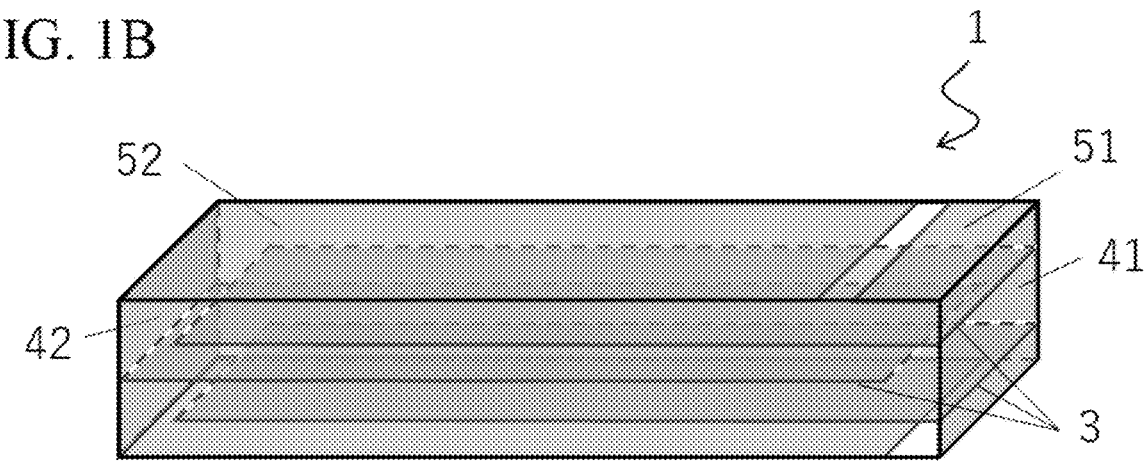

The multilayer piezoelectric element 1 shown schematically in FIGS. 1A and 1B comprises: a laminate body constituted by alternately-stacked piezoelectric ceramic layers 2 and internal electrode layers 3; a pair of connection conductors 41, 42 connected electrically to the alternate internal electrode layers 3; and surface electrodes 51, 52 provided on the surface of the laminate body and connected electrically to the pair of connection conductors, respectively. It should be noted that, while the drawings show a structure wherein the parts of the internal electrode layers 3 not connected to either connection conductor 41 or 42 are exposed on an end face of the element for easy identification of the positions of the internal electrode layers 3, the element structure is not limited to the foregoing and a structure wherein the parts of the internal electrode layers 3 not connected to either connection conductor 41 or 42 remain unexposed on any end face of the element, is also permitted.

The piezoelectric ceramic layers 2 are formed by the aforementioned piezoelectric ceramic and therefore not explained.

The internal electrode layers 3 are stacked alternately with the piezoelectric ceramic layers 2 in such a way that every other layer has one of two different electrode patterns, to constitute a multilayer structure on which the multilayer piezoelectric element 1 is based.

The electrode material with which to constitute the internal electrode layers 3 is not limited in any way so long as it is highly conductive and also physically and chemically stable in the use environment of the multilayer piezoelectric element 1. If the below-mentioned integral sintering of the piezoelectric ceramic layers 2 and internal electrode layers 3 is adopted when manufacturing the multilayer piezoelectric element 1, it is also required that the material is physically and chemically stable at the sintering temperature and in the sintering atmosphere. Examples of electrode materials that can be used include silver (Ag), copper (Cu), gold (Au), platinum (Pt), palladium (Pd), nickel (Ni), alloys thereof, and the like.

The connection conductors 41, 42 are connected electrically to the alternate internal electrode layers 3. To be specific, the connection conductor 41 is connected electrically to the odd-numbered internal electrode layers 3 as counted from the top, while the connection conductor 42 is connected electrically to the even-numbered internal electrode layers 3 as counted from the top. It should be noted that these electrical connections may be made by swapping the odd-numbered positions and the even-numbered positions. Also, while the connection conductors 41, 42 are connected to the exposed parts of the internal electrode layers 3 on the end faces of the multilayer piezoelectric element 1 in FIGS. 1A and 1B, the mode of connection between the connection conductors 41, 42 and the internal electrode layers 3 is not limited to the foregoing, and they may be connected by through holes (vias) that penetrate through the piezoelectric ceramic layers 2.

The material with which to constitute the connection conductors 41, 42 is not limited in any way so long as it is highly conductive and also physically and chemically stable in the use environment of the multilayer piezoelectric element 1. If the connection conductors 41, 42 are also formed by integral sintering with the piezoelectric ceramic layers 2, just like the internal electrode layers 3, it is also required that the material is physically and chemically stable at the sintering temperature and in the sintering atmosphere. Examples of electrode materials that can be used include silver (Ag), copper (Cu), gold (Au), platinum (Pt), palladium (Pd), nickel (Ni), alloys thereof, and the like. The electrode material with which to constitute the connection conductors

41, 42 may be the same as, or different from, the electrode material with which to constitute the internal electrode layers 3.

The surface electrodes 51, 52 are provided on the surface of the multilayer piezoelectric element 1 and connected electrically to the connection conductors 41, 42, respectively. If the aforementioned connection conductors 41, 42 are provided on the surface of the multilayer piezoelectric element 1, the connection conductors 41, 42 may function as the surface electrodes 51, 52 (i.e., separate surface electrodes 51, 52 are not required).

The electrode material with which to constitute the surface electrodes 51, 52 is not limited in any way so long as it is highly conductive and also physically and chemically stable in the use environment of the multilayer piezoelectric element 1. Examples of electrode materials that can be used include silver (Ag), copper (Cu), gold (Au), platinum (Pt), palladium (Pd), nickel (Ni), alloys thereof, and the like. The electrode material with which to constitute the surface electrodes 51, 52 may be the same as, or different from, the electrode material with which to constitute the internal electrode layers 3 and connection conductors 41, 42.

Method for Manufacturing Multilayer Piezoelectric Element

For the manufacturing of the aforementioned multilayer piezoelectric element 1, any general method for manufacturing a multilayer element may be adopted. As an example, a method whereby the piezoelectric ceramic layers 2 and internal electrode layers 3 are integrally sintered, is explained below.

First, the calcined powder from which to form the piezoelectric ceramic layers 2 is mixed with a binder, etc., to form a slurry or green body, which is then formed into sheet shape to obtain green sheets containing the calcined powder. For the sheet-forming method, the doctor blade method, extrusion method, or any other commonly used method may be adopted.

It should be noted that, when manufacturing a multilayer piezoelectric element 1 whose internal electrode layers 3 and connection conductors 41, 42 are connected by through holes (vias) as described above, the obtained green sheets are punched, irradiated with a laser beam, or otherwise processed to have through holes formed in them.

Next, electrode patterns which will become the internal electrode layers 3 after sintering, are formed on the green sheets containing the calcined powder. The electrode patterns may be formed by any commonly used method, but a method of printing or applying a paste that contains an electrode material is preferred in terms of cost. When the electrode patterns are to be formed by printing or application, the paste may contain glass frit or the calcined powder for piezoelectric ceramic (common material) to improve the adhesion strength to the piezoelectric ceramic layers 2 after sintering.

It should be noted that, when manufacturing a multilayer piezoelectric element 1 whose internal electrode layers 3 and connection conductors 41, 42 are connected by through holes (vias) as described above, an electrode material which will become the connection conductors 41, 42 after sintering is filled, before or after the forming of electrode patterns, in the through holes formed in the green sheets. Although the filling method is not limited in any way, a method of printing a paste that contains an electrode material is preferred in terms of cost.

Next, a prescribed number of the green sheets on which the electrode patterns have been formed are stacked, and then the sheets are bonded together, to obtain a formed green body. The stacking and bonding may be performed using any commonly used methods, but a method of thermally compressing the green sheets together using the action of the binder is preferred in terms of cost.

Next, the binder is removed from the formed green body which is then sintered. The binder removal and sintering may be performed successively using the same sintering system. The binder removal and sintering conditions may be set as deemed appropriate by considering the volatilization temperature and content of the binder, as well as the sintering property of the calcined powder, durability of the internal electrode material, and the like. If copper (Cu) or nickel (Ni) is used as the internal electrode material, preferably sintering is performed in a reducing or inert atmosphere to inhibit the internal electrodes from oxidizing. Examples of sintering conditions when the internal electrode material contains neither copper (Cu) nor nickel (Ni) include 1 to 5 hours at 900 to 1200° C. in the air. From the viewpoint of reducing the material cost by using a material of low melting point for the electrode material with which to constitute the internal electrode layers, preferably the sintering temperature is kept to 1100° C. or lower. It should be noted that, when obtaining multiple piezoelectric elements from one formed green body, the formed green body may be divided into several blocks prior to sintering.

When providing connection conductors 41, 42 on the surface of the multilayer piezoelectric element 1, the connection conductors 41, 42 are formed after sintering, on the end faces of the sintered body, in a manner connecting the internal electrode layers 3 exposed on the end faces. Also, surface electrodes 51, 52 are formed on the surface of the laminate body after sintering. The forming of connection conductors 41, 42 and/or surface electrodes 51, 52 may be performed by any commonly used method and, besides a method of printing or applying and then baking a paste that contains an electrode material, vapor deposition may also be adopted.

After the connection conductors 41, 42 and/or surface electrodes 51, 52 have been formed, polarization is performed under the aforementioned conditions to obtain a multilayer piezoelectric element 1.

EXAMPLE

The present invention is explained more specifically below using an example; it should be noted, however, that the present invention is not limited to this example.

EXAMPLE

Manufacturing of Piezoelectric Ceramic

As starting materials, high-purity bismuth oxide ($Bi_2O_3$), sodium carbonate ($Na_2CO_3$), barium carbonate ($BaCO_3$), titanium oxide ($TiO_2$), and manganese carbonate ($MnCO_3$) were used. For the titanium oxide, F-2 (specific surface area 30 m$^2$/g) by Showa Denko was used.

These starting materials were weighed, so that the piezoelectric ceramic to be obtained eventually had a composition of $(Bi_{0.425}Na_{0.425}Ba_{0.15})(Ti_{0.982}Mn_{0.018})O_3$ and the total mass of the materials amounted to 1 kg, and then introduced into a pot of 5 L in volume together with 6 kg of zirconia beads and 3 L of ethanol solvent, and the ingredients were wet-mixed for 16 hours at 100 rpm.

The zirconia beads were separated from the mixed slurry, after which the solvent was removed using an evaporator, and the resulting mixed powder was calcined under the conditions of 3 hours at 850° C. in the air, to obtain a calcined powder.

The obtained calcined powder was wet-disintegrated in a ball mill until coarse agglomerated grains were no longer seen, and then mixed with an acrylic binder and the mixture was uniaxially pressed under a tonnage of 2 tf, to obtain a disk-shaped compact with a diameter of 10 mm.

The obtained compact was sintered for 2 hours at 1080° C. in the air, to obtain the piezoelectric ceramic pertaining to the Example.

Grain Size Measurement of Piezoelectric Ceramic

When the average grain size $r_{avg}$ and coefficient of variation (CV) in grain size were determined for the obtained piezoelectric ceramic according to the aforementioned methods, $r_{avg}$ was 3.8 μm and CV was 29.7 percent.

Manufacturing of Piezoelectric Element for Testing

A silver (Ag) paste was applied all over on both sides of the aforementioned disk-shaped piezoelectric ceramic, which was then passed through a belt furnace set to 800° C. to bake the paste, thereby forming electrodes.

The piezoelectric ceramic on which the electrodes had been formed was polarized for 15 minutes at an electric field intensity of 6 kV/mm in 100° C. silicone oil, to obtain a piezoelectric element for testing.

Characteristics Measurement of Piezoelectric Element for Testing

The following measurements were performed on the piezoelectric element for testing 24 hours after the polarization.

Using an LCR meter, the capacitance C and dielectric loss tangent tan δ were measured under conditions of 1 kHz in frequency and 1 V in OSC. From the obtained value of capacitance C and the dimensions of the piezoelectric element for testing, the specific dielectric constant $\varepsilon_{33}^T/\varepsilon_0$ was calculated. As a result of measurement, the specific dielectric constant $\varepsilon_{33}^T/\varepsilon_0$ was 459, and the dielectric loss tangent tan δ was 0.91 percent.

Also, an impedance analyzer was used to measure the relationship of frequency and impedance, and the mechanical quality coefficient Qm was calculated using the resonance-antiresonance method. As a result of measurement, the mechanical quality coefficient Qm was 1096.

Furthermore, a $d_{33}$ meter (Berlincourt method) was used to measure the piezoelectric constant $d_{33}$. As a result of measurement, the piezoelectric constant $d_{33}$ was 95.2 pC/N.

Comparative Example

Manufacturing of Piezoelectric Ceramic

As starting materials, high-purity bismuth oxide ($Bi_2O_3$), sodium carbonate ($Na_2CO_3$), barium carbonate ($BaCO_3$), titanium oxide ($TiO_2$), and manganese carbonate ($MnCO_3$) were used. For the titanium oxide, CR-EL (specific surface area 6.5 m²/g) by Ishihara Sangyo Kaisha was used.

These starting materials were weighed, so that the piezoelectric ceramic to be obtained eventually had a composition of $(Bi_{0.425}Na_{0.425}Ba_{0.15})(Ti_{0.982}Mn_{0.018})O_3$ and the total mass of the materials amounted to 1 kg, and then introduced into a pot of 5 L in volume together with 3 kg of zirconia beads and 3 L of ethanol solvent, and the ingredients were wet-mixed for 16 hours at 100 rpm.

The zirconia beads were separated from the mixed slurry, after which the solvent was removed using an evaporator, and the resulting mixed powder was calcined under the conditions of 3 hours at 840° C. in the air, to obtain a calcined powder.

The obtained calcined powder was wet-disintegrated in a ball mill until coarse agglomerated grains were no longer seen, and then mixed with an acrylic binder and the mixture was uniaxially pressed under a tonnage of 2 tf, to obtain a disk-shaped compact with a diameter of 10 mm.

The obtained compact was sintered for 2 hours at 1030° C. in the air, to obtain the piezoelectric ceramic pertaining to the Comparative Example.

Grain Size Measurement of Piezoelectric Ceramic

When the average grain size $r_{avg}$ and the coefficient of variation (CV) in grain size were determined for the obtained piezoelectric ceramic according to the same methods in the Example, $r_{avg}$ was 2.9 μm and CV was 35.4 percent.

Manufacturing and Characteristics Measurement of Piezoelectric Element for Testing The aforementioned piezoelectric ceramic was processed in the same manner as in the Example, to obtain a piezoelectric element for testing pertaining to the Comparative Example.

When the obtained piezoelectric element for testing was measured for characteristics using the same methods in the Example, the specific dielectric constant $\varepsilon_{33}^T/\varepsilon_0$ was 539, the dielectric loss tangent tan δ was 1.05 percent, the mechanical quality coefficient Qm was 847, and the piezoelectric constant $d_{33}$ was 98.4 pC/N.

The results of the Example and Comparative Example are summarized and shown in Table 1.

TABLE 1

| | Ceramic grain size | | Piezoelectric characteristics | | |
|---|---|---|---|---|---|
| | Average grain size [μm] | CV [%] | tanδ [%] | $\varepsilon_{33}^T/\varepsilon_0$ | Qm | $d_{33}$ [pC/N] |
| Example | 3.8 | 29.7 | 0.91 | 459 | 1096 | 95.2 |
| Comparative Example | 2.9 | 35.4 | 1.05 | 539 | 847 | 98.4 |

Comparing the Example and the Comparative Example finds that the Example, where the value of coefficient of variation (CV) in grain size pertaining to the piezoelectric ceramic was smaller than that in the Comparative Example, resulted in a smaller value of dielectric loss tangent tan δ. Based on this result, it can be argued that, with respect to a piezoelectric ceramic, lowering the coefficient of variation (CV) in grain size among the grains contained therein can reduce its dielectric loss tangent tan δ.

Also, in the Example, a high mechanical quality coefficient Qm exceeding 1000 was achieved, which is likely due to a large average grain size $r_{avg}$ of the grains constituting the piezoelectric ceramic. The piezoelectric ceramic pertaining to this Example has a large average grain size $r_{avg}$, and a low coefficient of variation (CV) in grain size, pertaining to the grains contained therein, which means that the individual grains contained are large in size. Given the tendency confirmed by previous studies that a piezoelectric ceramic constituted by large grains has a high mechanical quality coefficient Qm, it is understood that a high mechanical quality coefficient Qm was also achieved in this Example where the individual grains were large in size.

In this disclosure, "a" may refer to a species or a genus including multiple species, "the invention" or "the present invention" may refer collectively to at least one of the aspects explicitly, necessarily, or inherently disclosed herein, and likewise, "the aspect" may refer collectively to at least one of the embodiments or examples explicitly, necessarily, or inherently disclosed herein.

INDUSTRIAL APPLICABILITY

According to the present invention, a piezoelectric ceramic presenting an improved dielectric loss tangent tan δ can be provided. Such piezoelectric ceramic, when used for an ultrasonic oscillator, provides a high-performance, highly-reliable element that keeps the amount of heat generated while being driven at levels lower than when the conventional piezoelectric ceramics are used. Particularly when the average grain size $r_{avg}$ of the grains in the piezoelectric ceramic is increased, the mechanical quality coefficient Qm will also improve and the element will demonstrate higher performance and reliability. In light of the above, piezoelectric elements featuring the piezoelectric ceramic pertaining to the present invention can be used favorably for ultrasonic oscillators.

We claim:

1. A piezoelectric ceramic that does not contain lead as a constituent element, the piezoelectric ceramic characterized in that:

a primary component is a perovskite compound expressed by a composition formula $(Bi_{0.5-x/2}Na_{0.5-x/2}Ba_x)(Ti_{1-y}Mn_y)O_3$ (where $0.01 \leq x \leq 0.25$, $0.001 \leq y \leq 0.020$); and a coefficient of variation (CV) in grain size among grains contained therein is 35 percent or lower.

2. The piezoelectric ceramic according to claim 1, wherein an average grain size $r_{avg}$ of the grains contained therein is 3 μm or larger.

3. A method for manufacturing a piezoelectric ceramic that does not contain lead as a constituent element, the method for manufacturing the piezoelectric ceramic is characterized by including:

mixing prescribed quantities of bismuth compound powder, sodium compound powder, barium compound powder, titanium compound powder, and manganese compound powder to obtain a mixed powder;

calcining the mixed powder to obtain a calcined powder;

compacting the calcined powder into a prescribed shape to obtain a compact; and sintering the compact to obtain a sintered compact whose primary component is a perovskite compound expressed by a composition formula $(Bi_{0.5-x/2}Na_{0.5-x/2}Ba_x)(Ti_{1-y}Mn_y)O_3$ (where $0.01 \leq x \leq 0.25$, $0.001 \leq y \leq 0.020$);

wherein the titanium compound powder represents $TiO_2$ with a specific surface area of 10 m$^2$/g or larger.

4. The method for manufacturing piezoelectric ceramic according to claim 3, wherein the sintering is performed at a temperature of 1100° C. or lower.

5. A piezoelectric element, comprising the piezoelectric ceramic of claim 1, and electrodes connected electrically to the piezoelectric ceramic.

6. The piezoelectric element according to claim 5, further comprising:

a laminate body constituted by alternately-stacked piezoelectric ceramic layers and internal electrode layers;

a pair of connection conductors connected electrically to the alternate internal electrode layers; and surface electrodes provided on a surface of the laminate body and connected electrically to the pair of connection conductors, respectively.

* * * * *